United States Patent
Jeon et al.

(10) Patent No.: US 10,056,140 B2
(45) Date of Patent: Aug. 21, 2018

(54) MEMRISTOR MEMORY WITH VOLATILE AND NON-VOLATILE STATES

(71) Applicant: Hewlett Packard Enterprise Development LP, Houston, TX (US)

(72) Inventors: Yoocharn Jeon, Palo Alto, CA (US); Martin Foltin, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/112,767

(22) PCT Filed: Jan. 30, 2014

(86) PCT No.: PCT/US2014/013885
§ 371 (c)(1),
(2) Date: Jul. 20, 2016

(87) PCT Pub. No.: WO2015/116107
PCT Pub. Date: Aug. 6, 2015

(65) Prior Publication Data
US 2016/0343435 A1    Nov. 24, 2016

(51) Int. Cl.
*G11C 13/00*    (2006.01)
*G11C 14/00*    (2006.01)

(52) U.S. Cl.
CPC ...... *G11C 13/0035* (2013.01); *G11C 13/0002* (2013.01); *G11C 13/004* (2013.01); *G11C 13/0007* (2013.01); *G11C 13/0033* (2013.01); *G11C 13/0069* (2013.01); *G11C 13/0097* (2013.01); *G11C 14/00* (2013.01)

(58) Field of Classification Search
CPC ............ G11C 13/0069; G11C 13/0097; G11C 13/004; G11C 13/0002; G11C 13/0007; G11C 13/0033; G11C 13/0035; G11C 14/00
See application file for complete search history.

(56) References Cited

U.S. PATENT DOCUMENTS

| | | | | |
|---|---|---|---|---|
| 5,528,535 A | * | 6/1996 | Honjo | G11C 11/22 365/145 |
| 5,768,182 A | * | 6/1998 | Hu | H01L 27/11502 257/295 |
| 5,910,911 A | * | 6/1999 | Sekiguchi | G11C 11/22 365/145 |
| 7,042,760 B2 | | 5/2006 | Hwang et al. | |

(Continued)

FOREIGN PATENT DOCUMENTS

WO    WO-2013016283 A1    1/2013

OTHER PUBLICATIONS

Bailey, K. et al., Operating System Implications of Fast, Cheap, Non-Volatile Memory, Proc. of the 13th HOTOS (2011), 5 pages.
(Continued)

*Primary Examiner* — Vanthu Nguyen
(74) *Attorney, Agent, or Firm* — Trop, Pruner & Hu, P.C.

(57) ABSTRACT

In an example, a method of controlling a memristor memory includes operating the memristor memory in a volatile mode, wherein switching a state of a memristor cell is with a low writing load. The method also includes operating the same memristor memory in a non-volatile mode, wherein switching a state of the memristor cell is with a high writing load.

18 Claims, 5 Drawing Sheets

(56) References Cited

U.S. PATENT DOCUMENTS

| | | | | |
|---|---|---|---|---|
| 7,349,238 B2* | 3/2008 | Gohou | ................... | G11C 11/22 |
| | | | | 365/145 |
| 7,824,953 B2* | 11/2010 | Suh | ................... | G11C 11/5678 |
| | | | | 257/2 |
| 8,036,016 B2 | 10/2011 | Sarker et al. | | |
| 8,050,083 B2 | 11/2011 | Ha et al. | | |
| 8,717,805 B2* | 5/2014 | Kajigaya | ................ | G11C 14/00 |
| | | | | 365/148 |
| 9,312,012 B2* | 4/2016 | Tailliet | ................... | G11C 16/14 |
| 2008/0054244 A1* | 3/2008 | Lee | .................... | H01L 27/2409 |
| | | | | 257/3 |
| 2008/0123418 A1 | 5/2008 | Widjaja | | |
| 2001/0227031 | 9/2011 | Li et al. | | |
| 2012/0005418 A1 | 1/2012 | Ribeiro et al. | | |
| 2012/0014175 A1 | 1/2012 | Wang et al. | | |
| 2012/0074372 A1 | 3/2012 | Yang et al. | | |
| 2012/0176831 A1 | 7/2012 | Xiao et al. | | |
| 2013/0250657 A1* | 9/2013 | Haukness | .......... | G11C 13/0069 |
| | | | | 365/148 |
| 2014/0293678 A1* | 10/2014 | Orlowski | ................ | H01L 45/08 |
| | | | | 365/148 |

OTHER PUBLICATIONS

PCT International Search Report & Written Opinion, dated Oct. 24, 2014, PCT Patent Application No. PCT/US2014/013885, 10 pages.

* cited by examiner

MEMRISTOR MEMORY WITH VOLATILE AND NON-VOLATILE STATES

BACKGROUND

The memristor ("memory resistor") was originally envisioned in 1971 by Leon Chua. Chua started by explaining the fundamental circuit elements: the resistor, capacitor, and inductor. Chua then proved that no combination of the other fundamental circuit elements (i.e., resistors, capacitors and inductors) could duplicate the properties of a memristor. This inability to duplicate the properties of a memristor with the other passive circuit elements makes the memristor another fundamental circuit element.

In 2008, a team at Hewlett-Packard (HP) Labs published the results of an analysis of a thin film of titanium dioxide made to behave as a memristor device. HP Labs went on to create an elementary circuit model that was defined by the same mathematical equations as those predicted by Chua for the memristor. The team then showed that this simple model could reproduce a wide variety of complex current-voltage (I-V) curves. The team also showed the equations for the drift of oxygen vacancies in titanium dioxide, and their influence on the electronic conduction in the material, were also identical with an equivalent circuit model, and thus the memristor equations.

From this, it was possible to develop a formula for the memristance of a device. This memristance formula showed that the size of the most important term in the memristance equations gets larger as the device size decreases. As such, understanding memristance is even more important as the size of circuits continue to get smaller. This is particularly true when designing electronic circuits in the realm of nano-size electronics.

DETAILED DESCRIPTION

A memristor memory with volatile and non-volatile states is disclosed. The memristor memory exhibits properties of memristance, including a dynamic relationship between current and voltage. The most recognizable signature of a memristor is that when an AC voltage is applied to the device, the current-voltage (I-V) plot is a Lissajous figure with a pinched hysteresis. The most commonly observed I-V trace is a 'figure 8', or a 'pinched loop' for which the current is zero when the voltage is zero. The memristor memory also exhibits a "memory" of past voltages or currents, thus having particular application in the non-volatile memory space.

Memristor devices that can be fashioned into non-volatile memory devices enable greater data density than hard drives, with access times similar to dynamic random access memory (DRAM). For example, a crossbar implementing memristor memory can fit 100 gigabits in a square centimeter. Access times can be as fast as 50 nanoseconds, if not faster. This is approximately one hundred times faster than contemporaneous flash memory, while using only one percent as much energy as flash memory.

Memristor-based devices operate by the movement of atoms, ions, vacancies, and/or impurities caused by the application of current/voltage exceeding a certain magnitude to change the state of the device (write and erase processes). Once these atomic motions are completed, the device state is determined (read) at lower currents and voltages.

A memristor exhibits a very long endurance when operated under normal or "optimal" switching conditions. A memristor can be repeatedly driven into one of the states (e.g., high "1" or low "0") and back again without exhibiting near-term negative effects on the device structure. Such operation is referred to herein as operating in a volatile state. In the volatile state, the memristor will "remember" the last state for some short duration, typically long enough for ongoing computer processing operations. That is, the memristor retains the data value that has been written long enough that the data value can be read back and is no longer needed in memory.

A memristor can also be over-driven to one of the states (e.g., high "1" or low "0"). In this over-driven state, the memristor memory retains the data longer than when operating in the volatile state. Such operation is referred to herein as operating a non-volatile state. That is. the memristor will "remember" the last state for a prolonged time, typically suitable for longer term data storage operations.

However, operating the memristor memory in a non-volatile state requires application of "harder" set/reset pulses (e.g., a higher voltage or a longer bias). These harder set/reset pulses are typically beyond the normal or "optimal" operating voltages for volatile operations (e.g., those needed to ordinarily change states). This may cause intermittent write failures, and over time, may lead to device failure.

A memristor memory is disclosed that operates both in a volatile switching mode (or "volatile mode") enabling more frequent read/writes; and in a non-volatile switching mode (or "non-volatile mode") enabling longer data retention. In an example, a controller operates the memristor memory in both modes. In the volatile mode, switching a state of a memristor cell is with a low writing load. Operating the memristor memory in the volatile mode may be used for ongoing computer processing operations. In a non-volatile mode, switching a state of the memristor cell is with a high writing load. Operating the memristor memory in the non-volatile mode may be used for long-term computer storage operations. In an example, operation in the non-volatile mode is limited in some regard (e.g., frequency), to extend the usable life of the memristor memory.

In an example, the controller monitors state switches of the memristor cell(s) when operating in the non-volatile mode. The controller may flag the memristor cell for use only in the volatile mode after a threshold is met for operating the memristor cell in the non-volatile mode. In an example, the controller prevents operation of the memristor cell in the non-volatile mode after reaching a threshold of state switches.

For purposes of illustration, the memristor memory may include an array of memristor cells. Each memristor cell is configured to change state based on application of an electric potential. For example, the plurality of memristor cells may be configured as an array (e.g., a memory array). Each memristor cell represents an individual memristor device structure. That is. each memristor cell is a two-terminal memristor device. The memristor cells may be individually addressable, e.g., as discrete memory locations.

Each of the memristor cells in the array is initially operable in both the volatile mode and the non-volatile mode. In an example, all of the memristor cells in the array may be flagged as operable in only the volatile mode after an operating threshold is reached. In another example, only the memristor cells in the array which have reached an operating threshold are flagged as operable in only the volatile mode. In this example, other memristor cells in the array continue to operate in both the volatile mode and the non-volatile mode even after the memristor cells in the array which have reached an operating threshold are flagged as operable in only the volatile mode.

Before continuing, it is noted that as used herein, the terms "includes" and "including" mean, but are not limited to, "includes" or "including" and "includes at least" or "including at least." The term "based on" means "based on" and "based at least in part on."

In theory, an ideal memristor is defined as a passive two-terminal electronic device that is built to express only the property of memristance (just as a resistor expresses resistance and an inductor expresses inductance). Another way of describing a memristor is as any passive two-terminal circuit element that maintains a functional relationship between the time integral of current (called charge) and the time integral of voltage (often called flux, as it is related to magnetic flux). The slope of this function is called the memristance M, and is similar in some regards to variable resistance.

In practice, however, it may be difficult to build a 'pure memristor,' because an actual device may have a small amount of some other property, such as capacitance (just as an actual, non-theoretical inductor also exhibits resistance). Therefore, the term "memristor" is used herein to mean any device which exhibits properties of memristance, whether a 'pure' or theoretical memristor, or an actual device at least exhibiting some properties of memristance (although the device may also exhibit some amount of capacitance, resistance and/or inductance).

The definition of a memristor is based on the fundamental circuit variables of current and voltage and associated time-integrals (e.g., like the resistor, capacitor and inductor). But unlike these other three elements, which are allowed in linear time-invariant (LTI) system theory, memristors have a dynamic function with memory and may be described as some function of net charge. As such, to date there is no such thing as a "standard" memristor. Instead, each device implements a particular function. wherein the integral of voltage determines the integral of current, and vice versa.

Figure 1A:
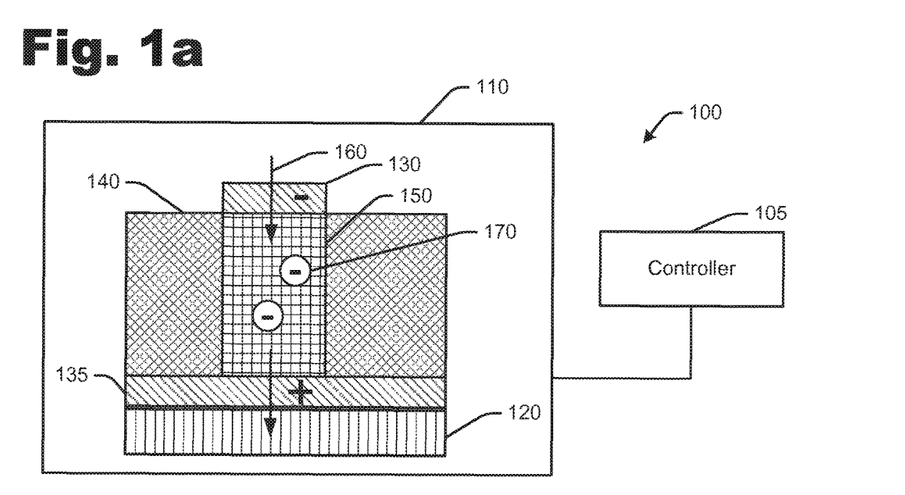
FIGS. 1*a-b* illustrate an example memristor memory with volatile and non-volatile states.
Figure 1B:
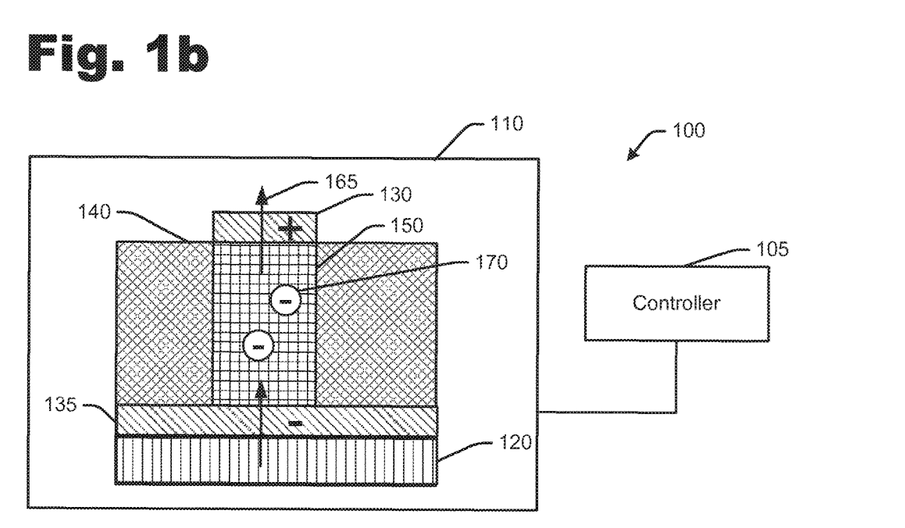

Figures 1a-b illustrate an example memristor memory 100 with volatile and non-volatile states. The memristor memory 100 may include a controller 105 operatively associated with a memristor element or "cell" 110. In an example, the controller 105 may be operatively associated with an individual memristor cell 110 on a one-to-one basis, e.g., as illustrated in FIGS. 1a-b. In another example. the controller 105 may be operatively associated with a plurality of memristor cells 110 (e.g., an array of cells 110). In another example, the controller 105 may include a plurality of controllers, such as individual controllers each associated with individual memristor cells 110 (e.g., on a one-to-one basis). In this example, the controller 105 may include or be further associated with a "master" controller which controls a plurality (e.g., "array" or "bank") of controllers.

Each memristor cell 110 may be implemented as a memristor device structure. An example device structure is shown in FIGS. 1a-b, and includes a substrate 120 (e.g., silicon), a first electrode 130, a second electrode 135, an insulator 140, and a channel 150 formed between the first and second electrodes.

In an example, the device structure is fabricated by depositing and etching layers on the substrate 120 where the device is to be fabricated. By deposition, a 'bottom' metal electrode 135 is formed to inject or remove charges from the channel 150. The channel 150 is fabricated by additive deposition of a material such as tantalum oxide, hafnium oxide, titanium oxide, or other metal oxides on the second electrode 135. Then an insulating charge barrier 140 (e.g., silicon nitride, aluminum oxide, $SiO_2$) is deposited or thermally grown on the sidewall. A top electrode 130 is fabricated on top of the channel 150 to complete the device structure.

It is noted that the terms "top" and "bottom" are used with reference to the deposition layers, with bottom layers being deposited first, with "top" layers being deposited over the "bottom" layers. While these terms are illustrative with reference to the figures, and may be useful during fabrication, the terms "top" and "bottom" are not intended to be limiting of the device structure in any manner.

Any suitable fabrication processes may be implemented to manufacture the device structure. For example, fabrication techniques may be similar to those used to produce titanium dioxide memristors, ferroelectric memristors, spin-transfer torque magnetoresistance devices, spin memristive systems, and/or other techniques now known or later developed. It is noted that the memristor cell 110 utilizes fabrication techniques developed for flash memory. For example, many of the materials and processing facilities are similar and/or the same as those used to fabricate CMOS and flash memory devices. As such, fabrication of the memristor cell 110 is highly compatible with present chip fabrication facilities.

In an example, fabrication can proceed at lower temperatures than conventional memory systems fabrication. For example, the memristor memory 100 may be fabricated at temperatures less than 800-900° C., and in another example at temperatures of about 300-400° C. These lower temperatures enable the memristor memory 100 to be fabricated over CMOS, control/drive electronics, and/or other circuitry, without damaging the underlying circuitry. As such, the memristor memory 100 may have a device structure implemented in an additive (e.g., stacked and/or side-by-side) configuration. Such a configuration enables multiple memory elements to be fabricated together, increasing memory density and decreasing the device footprint and associated cost.

Before continuing, it should be noted that the examples described above are provided to illustrate an example device structure and fabrication technique. These examples are not intended to be limiting. Other devices structures and/or fabrication techniques may be implemented.

To understand operation of the device structure shown in FIGS. 1a-b, it is helpful to first explain the fundamental properties of memristance. If charge flows in one direction (e.g., as illustrated by arrows 160 in FIG. 1a) through the device structure, the resistance of the circuit increases. If charge flows in the opposite direction (e.g., as illustrated by arrows 165 in FIG. 1b) in the circuit, the resistance decreases.

A common analogy in electronics for a capacitor is to think of it as a bucket that stores water (i.e., the water is analogous to electrical charge). Likewise, an analogy for a resistor is to think of it as a pipe that carries water. Again, the water is analogous to electrical charge. But for a resistor, the pressure at the input of the pipe behaves similar to voltage, and the rate of flow of the water through the pipe behaves similar to electrical current. The flow of water through the pipe is faster if the pipe is shorter and/or has a larger diameter; just as with the resistor.

A similar analogy can be made for a memristor. But instead of the pipe having a fixed diameter (i.e., like the resistor in the above analogy has a fixed resistance), a memristor can be described as a type of pipe that expands or shrinks when water flows through it. If water flows through the pipe in one direction, the diameter of the pipe increases, thus enabling the water to flow faster. If water flows through the pipe in the opposite direction, the diameter of the pipe decreases, thus slowing down the flow of water. If the water pressure is turned off, the pipe will retain its most recent diameter until the water is turned back on. Thus, the pipe does not store water like a bucket (analogous to a capacitor). Instead, the memristor remembers how much water (analogous to electric charge) flowed through it.

The direction of charge flowing through the device structure is based on polarity of an electric potential across the channel 150 (e.g., a voltage applied to the electrodes 130, 135). For example, in FIG. 1*a*, a voltage is applied to the top (e.g., negative) terminal 130, causing charge carriers 170 (e.g., electrons) to flow toward the bottom (e.g., positive) terminal 135. In FIG. 1*b*, the polarity is reversed. That is, the voltage is applied to the bottom (e.g., negative) terminal 135, causing charge carriers 170 (e.g., electrons) to flow toward the top (e.g., positive) terminal 130.

The memristor memory 100 is said to have a regime of operation with an approximately linear charge-resistance relationship, as long as the time-integral of the current stays within certain bounds. That is, memristor resistance depends on the integral of the input applied to the terminals (rather than on the instantaneous value of the input as in a varistor).

If the flow of charge carriers 170 is stopped (e.g. by turning off the applied voltage), the memristor device 100 will 'remember' the last resistance of the circuit (e.g., a high resistance or a low resistance). When the flow of charge carriers 170 starts again (e.g., by turning on the applied voltage), the resistance of the circuit will be what it was when last active (e.g., the circuit will he in a high resistance state or a low resistance state). This resistance can be correlated, in terms of computer memory, to a high (or "1") or a low (or "0") memory state. Accordingly, the device structure can be used to retain bit values. Multiple devices may be implemented (e.g., as an array) to retain multiple bits or bytes in a computer memory.

Memristors are unique in the memory space, because of their ability to "remember" the last state of the device (e.g., a high or low). Application of the memristor in the memory space may include, by way of non-limiting example, a type of non-volatile random access memory, or NVRAM. Such a memory has very useful properties, in that the memristor does not 'forget' the stored data even after the power is turned off. As such, memristor-based memory is a strong competitor in the flash memory market. As such, a voltage has to be applied to the memristor device structure in order to change the current state (e.g., from a high to a low; or a low to a high).

In conventional memory, the desired value is simply written to the memory address. While a similar approach may be used for memristor-based memory, an electric potential has to be applied to the memristor device structure each time to change its state (e.g., as explained above with reference to FIGS. 1*a-b*). While a memristor can readily operate in a volatile mode, "harder" pulses are needed to switch the memristor in a non-volatile mode. These harder pulses result in wider excursions from the desired (e.g., "best") operating conditions, as can be seen in the illustration shown in FIG. 2, and hence should be limited in nature.

Figure 2:
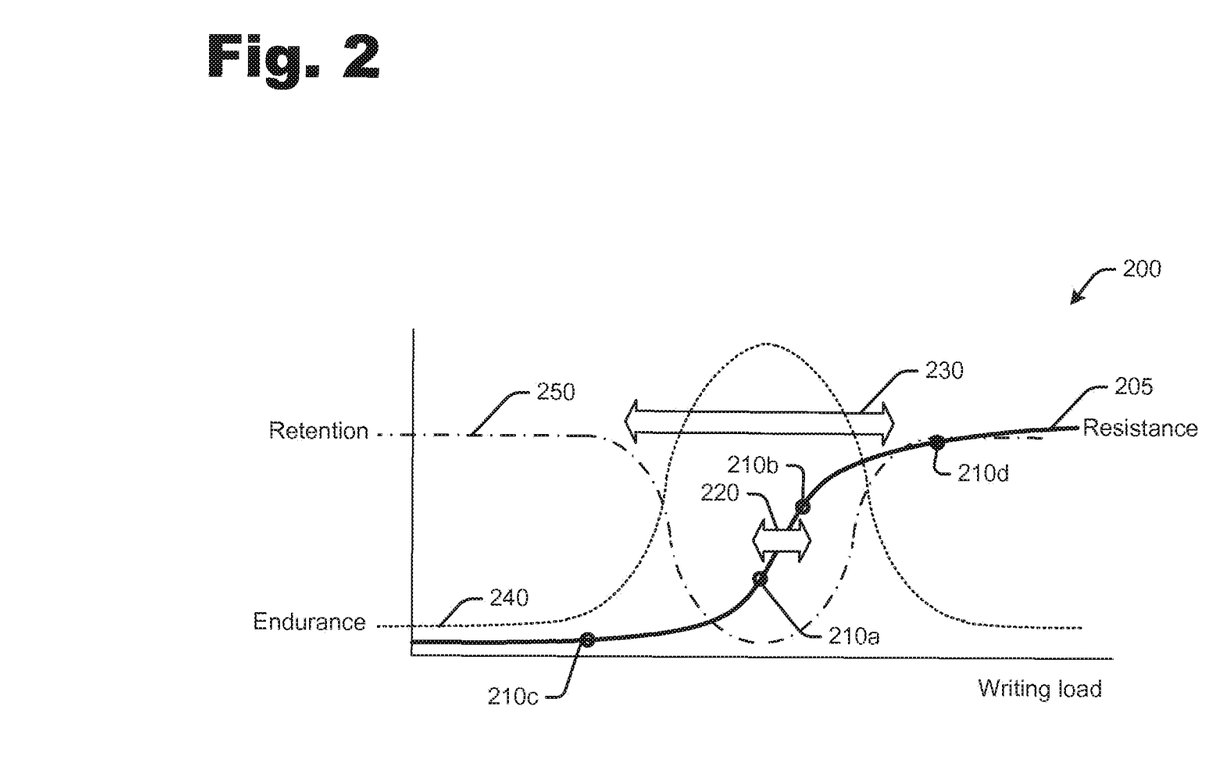
FIG. 2 is a plot illustrating operational states of an example memristor memory.

FIG. 2 is a plot 200 illustrating operational states of an example memristor memory. Plot 200 shows a resistance curve 205 as a function of the writing load. During operation, a memristor is operable under continuously changing conditions for use with various writing loads. When a memristor is switched between two lightly written states (e.g., a standard "1" or a standard "0"), the data is not retained as long, but this switching generally causes little wear on the device structure. The further the memristor is driven to one of the extremes (e.g., a hard "1" or a hard "0"), the more stable the state is and the longer the data can be retained. However, the lifetime of the memristor can be shortened by switching too often between two opposite stable states. This can be visualized by the plot shown in FIG. 2.

During use in a volatile mode, the memristor device (e.g., memristor cell 110 shown in FIGS. 1*a-b*) is operated in the middle of the curve, as illustrated between set points 210*a* and 210*b*. That is. the memristor device may be driven to a first state (e.g., a "1" or "0") by applying a first electric potential (e.g., charge carrier flow illustrated in the direction of arrow 160 in FIG. 1*a*). The memristor device may be driven to a second, opposite state (e.g., a "0" or "1") by applying a second. opposite electric potential (e.g., charge carrier flow illustrated in the direction of arrow 165 in FIG. 1*b*).

Under typical operating conditions (i.e., volatile mode), a normal reset pulse can be used to switch the memristor device between states. For example, if the memristor device is storing a "0" (has a low resistance on curve 205), the state of the memristor device can be changed to a "1" (having a high resistance on curve 205) with a normal reset pulse 220 in a first direction. Likewise, if the memristor device is storing a "1" (has a high resistance on curve 205), the state of the memristor device can be changed to a "0" (having a low resistance on curve 205) with a normal reset pulse 220 in a second, opposite direction. It is noted that 'direction' as used with reference to FIG. 2 refers to a positive/negative electric potential, but is not intended to be limiting in any manner.

When the memristor device is to "remember" a stored value for a longer retention period (e.g., for longer-term data storage), then a harder set pulse 230 has to be applied. For example, a harder set pulse 230 may switch the memristor at a lower resistance value 210*c* and/or higher resistance value 210*d*. Once in a non-volatile state 210*c* or 210*d*, a harder reset pulse (e.g., higher voltage and/or a longer bias) is needed to return the device structure to normal operating conditions (e.g., volatile mode). For example, reset pulse 230 (e.g., a higher voltage and/or a longer bias than set pulse 220*b*) is needed to return the state of the memristor device back to a normal operating range between set points 210*a-b*.

While operating in volatile mode (e.g., between set points 210*a-b*), the memristor device typically exhibits better endurance (e.g., a longer lifetime), as indicated by curve 240. But the memristor device has a shorter retention time for storing data (e.g., cannot store data as long), as indicated by curve 250. To the contrary, while operating in non-volatile mode (e.g., between set points 210*c-d*), the memristor device does not have as good endurance (e.g., a shorter lifetime), as indicated by curve 240. But the memristor device has a longer retention time for storing data (e.g., can store data longer), as indicated by curve 250.

It is desirable in many computing applications to use the same memory for both long term storage and for short term storage. It is also desirable to extend the useful life of memory. The memristor memory disclosed herein is operable in both volatile and non-volatile modes. In addition, the memristor cells may be monitored so that operation in the non-volatile mode is limited in some manner, thereby extending the useful life of the memristor memory. Examples of operating a memristor memory in both states can be better understood with reference to the illustrations in FIGS. 3a-b and 4-ab.

Figure 3A:
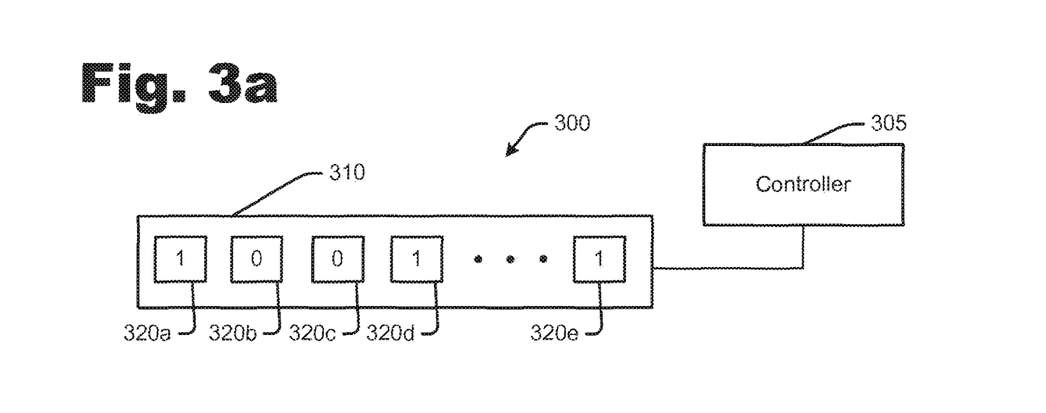
FIGS. 3*a-b* illustrate an example memristor memory operating in both volatile and non-volatile states.
Figure 3B:
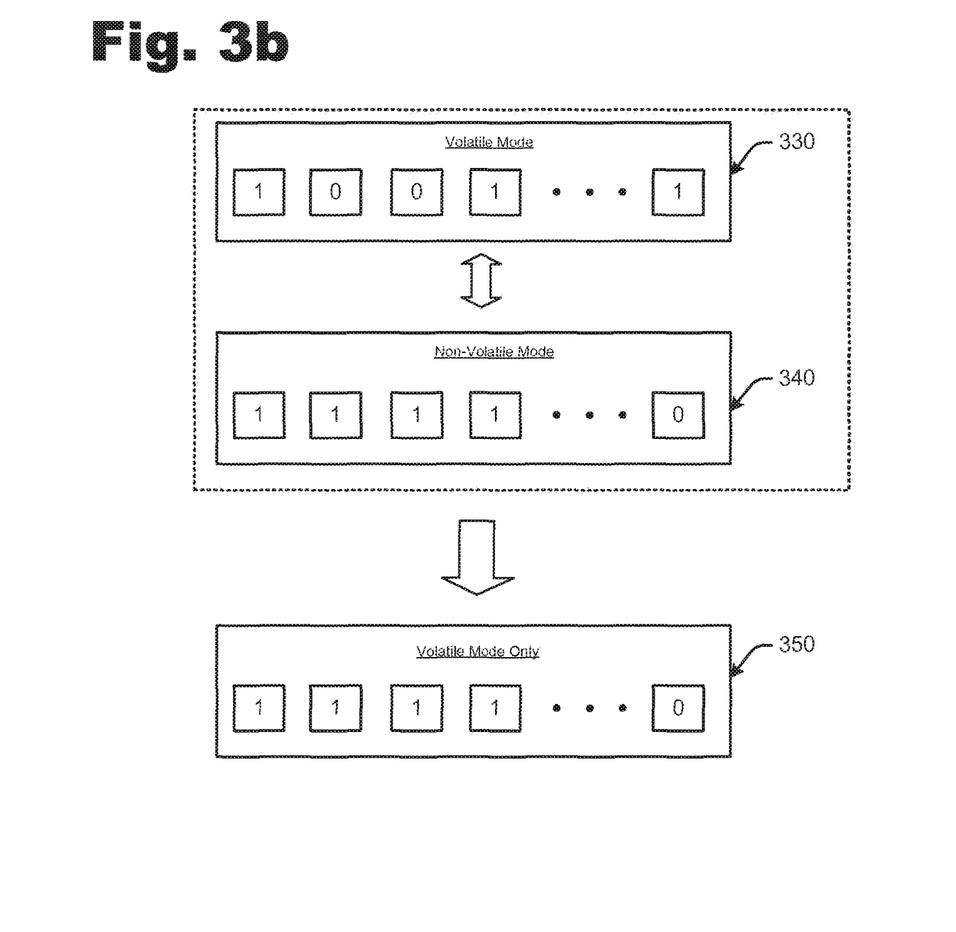

FIGS. 3a-b illustrate an example memristor memory operating in both volatile and non-volatile states. An example memristor memory 300 is illustrated in FIG. 3a including a controller 305 and memory array 310. The memory array 310 includes a plurality of memristor cells 320a-e (e.g. a memory array).

The memristor memory 300 is operable in both a volatile mode (wherein data is retained for a relatively short time but the switching has little negative impact on the device structure). and a non-volatile mode (wherein long term data retention is desired). Both modes of operation are illustrated in FIG. 3b. In the volatile mode 330, stored data may not be retained as long, but the update frequency is sufficiently high so that the contents are re-written before the information is lost. The memristor cells can be repeatedly switched in volatile mode without exhibiting any significant signs of degradation to the device structure.

When the data needs to be stored for a longer time (typically without updating), the memristor memory 300 can be written to a stable state (i.e., in a non-volatile mode 340). This process may incur a higher writing stress on the device structure, due to use of harder set/reset pulses. Thus only a limited number of re-writes are permitted (e.g., as determined by a threshold). In an example, writing in the non-volatile mode may be limited for only long term storage, reducing the frequency of operation in this mode to maintain a useable lifetime of the device structure.

In the illustration shown in FIGS. 3a-b, the controller 305 monitors a number of state switches of the memristor memory 300 in the non-volatile mode 340. The controller flags the memristor memory 300 after a threshold is met for operating the memristor cell in the non-volatile mode. For example, the controller may compare the number of hard switches to a threshold. When the threshold is satisfied (e.g., the threshold is met), the controller flags the memristor memory 300. It is noted that multiple thresholds may be used. For example, a first threshold may be used to issue a warning to an administrator and a second threshold may be used to change the operating mode of the memristor memory 300. It is noted that the threshold may be applied to the entire memristor memory 300, even if only one of the cells 320a-e triggers the threshold. Such a threshold is referred to as a "lowest common denominator." because the memristor memory 300 is flagged based on only one of the cells 320a-e reaching the threshold. In another example, instead of applying one threshold to the entire memory, a different memristor memory implementation may use a separate threshold for each memory region encompassing a plurality of memristive cells accessed through memory addresses in specific range (e.g., a memory "block").

In an example, the controller 305 changes the memristor memory 300 to a volatile-mode-only 350 to prevent operation of the memristor memory in the non-volatile mode after reaching a predetermined number of state switches. In this example, all of the memristor cells 320a-e in the array 310 may be flagged as operable in only the volatile mode after an operating threshold is reached.

Figure 4A:
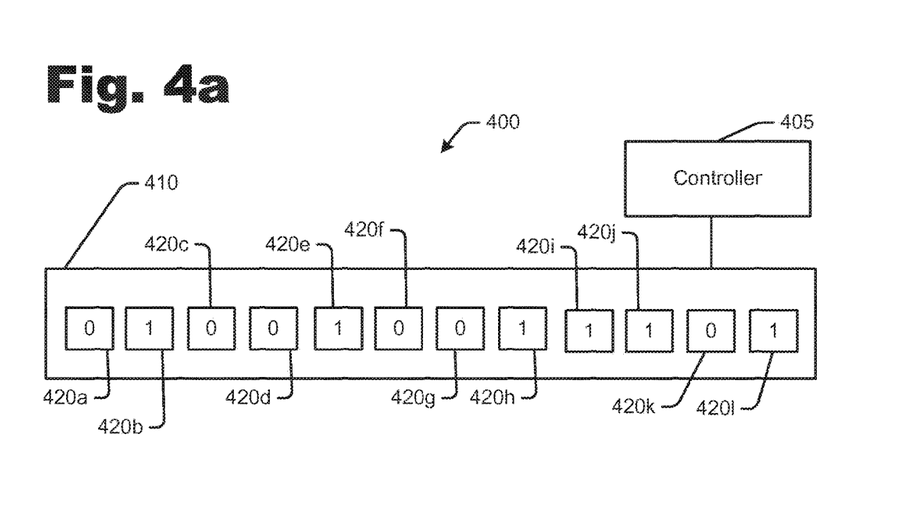
FIGS. 4*a-b* illustrate another example memristor memory operating in both volatile and non-volatile states.
Figure 4B:
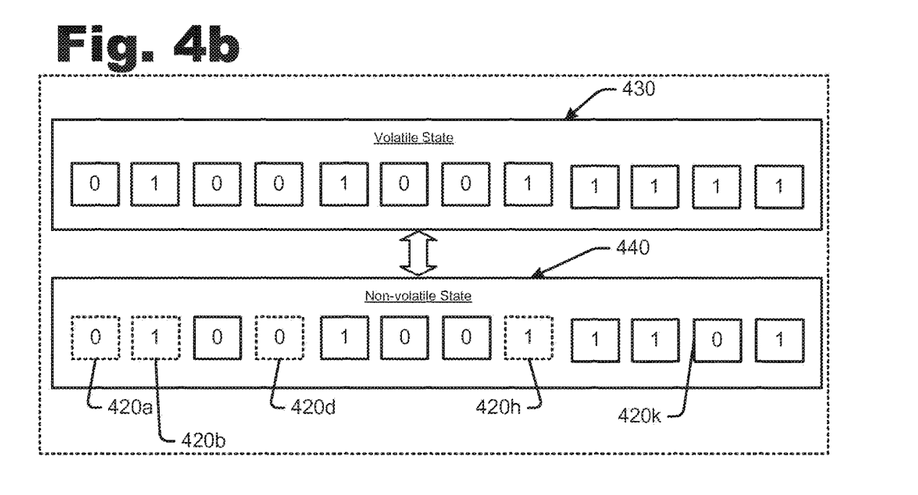

FIGS. 4a-b illustrate another example memristor memory operating in both volatile and non-volatile states. An example memristor memory 400 is illustrated in FIG. 4a including a controller 405 and memory array 410. The memory array 410 includes a plurality of memristor cells 420a-l. Again, the memristor memory 400 is operable in both a volatile mode 430 and a non-volatile mode 440, as illustrated by FIG. 4b.

In this illustration, the controller 405 monitors a number of state switches of the memristor memory 400 in the non-volatile mode 440. Again, the controller flags the memristor memory 400 after a threshold is met for operating the memristor cell in the non-volatile mode. In an example, the controller 405 changes one or more cells of the memristor memory 400 to a volatile-mode-only 450. In this example. individual cells (illustrated by cells 420a, 420b, and 420h in FIG. 4b) are prevented from operating in the non-volatile mode after reaching a predetermined number of state switches.

Accordingly, only the memristor cells 420a, 420b, and 420h in the array 410 which have reached an operating threshold are flagged as operable in only the volatile mode. The other memristor cells 420c-g. 420i -j, and 420l in the array 410 continue to operate in both the volatile mode and the non-volatile mode. That is, memristor cells 420c-g, 420i-j, and 420l are bi-modal even after some of the memristor cells 420a, 420b. and 420h have reached an operating threshold are flagged as operable in only the volatile mode.

Other examples to operate a memristor memory in multiple modes are also contemplated.

Figure 5:
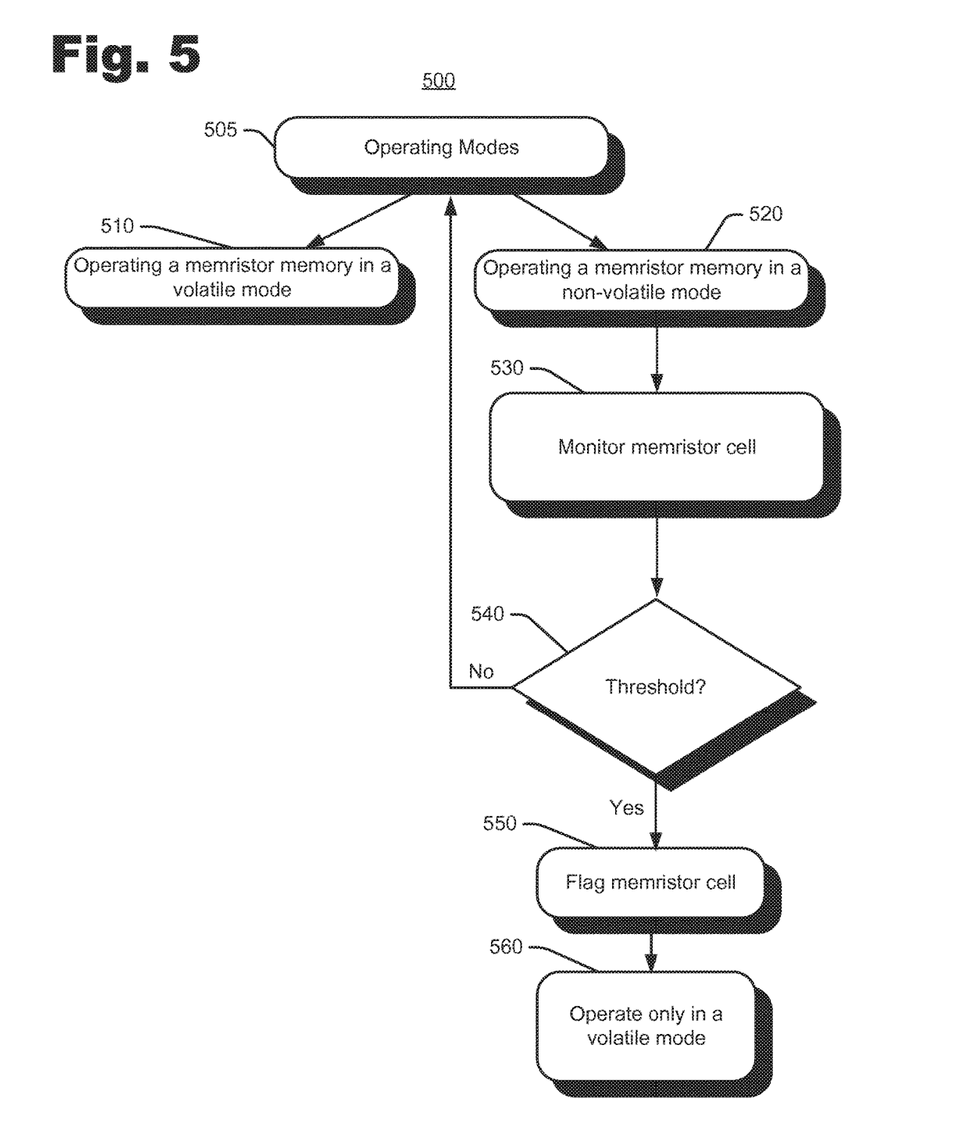
FIG. 5 is a flow chart illustrating example operations of a memristor memory in both volatile and non-volatile states.

FIG. 5 is a flow chart illustrating example operations 500 of a memristor memory which can operate volatile and non-volatile states. In the example illustrated in FIG. 5, a memristor memory includes an array of memristor cells, wherein each of the memristor cells in the array is initially operable in a volatile mode and a non-volatile mode, as illustrated by beginning operating modes 505.

Operation 510 includes operating the memristor memory in a volatile mode. In an example, the volatile mode is for ongoing computer processing operations. In the volatile mode, a state of a memristor cell is switched with a low writing load.

Operation 520 includes operating the same memristor memory in a non-volatile mode. In the non-volatile mode, a state of the memristor cell is switched with a high writing load. In an example, the writing load may he of different electric potentials. In another example, the writing loads may be of different potential durations.

The ordering of these operations is not intended to be limiting. That is, the memristor memory may operate first in a volatile mode, and then in a non-volatile mode, or vice versa with the memristor memory first operating in a non-volatile mode and then in a volatile mode. Nor are the operations limited to switching back and forth between the two modes in any order or after any number of operations. For example, the memristor memory may be operated in the volatile mode for hundreds, thousands (or even more) read/write operations, before switching to the non-volatile mode. The memristor memory may then continue to operate in the non-volatile mode or be returned to volatile mode after only a single operation in the non-volatile mode.

When operating in the non-volatile mode, in operation 530 a memristor cell is monitored (e.g., by the controller described above). Monitoring may include monitoring a number of state switches of the memristor cell(s) of the memristor memory in the non-volatile mode. In an example, the nonvolatile mode is for long-term computer storage operations. A determination 540 is made whether operating the memristor cell(s) reaches a threshold.

Any suitable threshold may be implemented. For example, the threshold may be pre-assigned during fabrication of the memristor memory. The threshold may be pre-assigned based on materials used to manufacture the memristor cells. For example, some materials may be more resilient and thus have a higher threshold for operating in the non-volatile mode. The threshold may also be pre-assigned based on testing by the manufacturer and/or feedback from industry. In another example, the threshold may be dynamic. A dynamic threshold may be determined based on actual use and may change for various conditions. In another example, a dynamic threshold may be based on real-time measurements, such as failures or error rates measured during read/write operations.

If the threshold is not reached in operation 540, then operations may continue as before. That is, the memristor memory may continue to operate in both a volatile mode and a non-volatile mode. as illustrated in FIG. 5 by the arrow returning to operation 505.

If in operation 540 the threshold is met for operating the memristor cell in the non-volatile mode, then in operation 550 the memristor cell may be flagged. In an example, the memristor is flagged only for use in the volatile mode, as illustrated by operation 560. In this example, operations may further prevent operation of the memristor cell in the non-volatile mode after reaching a predetermined number of state switches.

In an example, all of the memristor cells in an array may be flagged as operable in only the volatile mode after an operating threshold is reached. In another example, only the memristor cells in the array which have reached an operating threshold are flagged as operable in only the volatile mode. In this example. the other memristor cells in the array continue to operate in both the volatile mode and the non-volatile mode.

In another example, the memristor cell may continue to be used after reaching the threshold. For example, the memristor cell may be flagged before it is no longer suitable for use in the non-volatile mode. For example, an administrator may be notified that the memristor cell(s) should be replaced (e.g., within a specified time frame or use cycle).

The operations shown and described herein are provided to illustrate example implementations. It is noted that the operations are not limited to the ordering shown. Still other operations may also be implemented.

The operations described above enable a memristor memory to be used for both short-term memory during ongoing computer processing (e.g., in volatile mode), and longer-term computer storage applications. In non-volatile mode, the memristor memory is only used for storage applications where the number of re-writing is limited because the endurance level of the memristor is only sufficient for that. If the memristor memory were to be used in a computing memory non-volatile mode, the frequent rewriting (under high switching potentials) would wear out the device structure in only a short time. Before long, the memristor cell would lose its memory function, resulting in read/write errors. However, if the memristor is monitored when used in both the volatile and non-volatile modes, the memristor memory can be used for computing (e.g., just as a DRAM), and also store data in nonvolatile mode without refresh for a long period of time in the same device. as needed. It can be seen that the operations described herein may help extend the life of memristor memory.

It is noted that the examples shown and described are provided for purposes of illustration and are not intended to be limiting. Still other examples are also contemplated.

The invention claimed is:

1. A method of controlling a memristor memory, comprising:
   operating the memristor memory in a volatile mode wherein switching a state of a memristor cell in the memristor memory is with a low writing load, wherein the memristor cell comprises a channel having a resistance, the resistance of the channel set to a first resistance value in response to a current flow in a first direction through the channel, and the resistance set to a different second resistance value in response to a current flow in a different second direction through the channel, wherein the first resistance value represents a first state of the memristor cell, and the second resistance value represents a second state of the memristor cell, and wherein the channel is formed of a material selected from the group consisting of tantalum oxide, hafnium oxide, and titanium oxide;
   operating the same memristor memory in a non-volatile mode wherein switching a state of the memristor cell is with a high writing load; and
   monitoring a number of state switches of the memristor cell in the non-volatile mode, and flagging the memristor cell for use only in the volatile mode after a threshold of the number of state switches in the non-volatile mode is met for operating the memristor cell in the non-volatile mode.

2. The method of claim 1, further comprising preventing operation of the memristor cell in the non-volatile mode after reaching the threshold of the number of state switches in the non-volatile mode.

3. The method of claim 1, wherein the memristor memory includes an array of memristor cells, wherein each of the memristor cells in the array is initially operable in both the volatile mode and the non-volatile mode.

4. The method of claim 3, wherein all of the memristor cells in the array are flagged as operable in only the volatile mode after the threshold of the number of state switches in the non-volatile mode is reached.

5. The method of claim 3, wherein only the memristor cells in the array which have reached the threshold of the number of state switches in the non-volatile mode are flagged as operable in only the volatile mode, and other memristor cells in the array continue to operate in both the volatile mode and the non-volatile mode.

6. The method of claim 1, wherein operating the memristor memory in the volatile mode is for ongoing computer processing operations.

7. The method of claim 1, wherein operating the memristor memory in the non-volatile mode is for long-term computer storage operations.

8. A memristor memory comprising:
   a memristor cell configured to change state based on application of an electric potential, the memristor cell comprising a channel having a resistance, the resistance of the channel set to a first resistance value in response to a current flow in a first direction through the channel, and the resistance set to a different second resistance value in response to a current flow in a different second direction through the channel, wherein the first resistance value represents a first state of the memristor cell, and the second resistance value represents a second state of the memristor cell, wherein the channel is formed of a material selected from the group consisting of tantalum oxide, hafnium oxide, and titanium oxide; and a controller to:
operate the memristor cell in a volatile mode by switching a state of the memristor cell with a low writing load, and in a non-volatile mode by switching a state of the memristor cell with a high writing load;
monitor a number of state switches of the memristor cell in the non-volatile mode; and
flag the memristor cell for use only in the volatile mode after a threshold is met for operating the memristor cell in the non-volatile mode.

9. The memristor memory of claim 8, wherein the controller is to prevent operation of the memristor cell in the non-volatile mode after reaching a predetermined number of state switches in the non-volatile mode.

10. The memristor memory of claim 8, wherein the memristor memory includes an array of memristor cells, wherein each of the memristor cells in the array is initially operable in both the volatile mode and the non-volatile mode.

11. The memristor memory of claim 10, wherein the controller is to flag all of the memristor cells in the array as operable in only the volatile mode after the threshold is met for operating the memrister cell in the non-volatile mode.

12. The memristor memory of claim 10, wherein the controller is to flag only the memristor cells in the array which have reached the threshold as operable in only the volatile mode.

13. The memristor memory of claim 12, wherein the controller is to flag other memristor cells in the array as operable in both the volatile mode and the non-volatile mode even after the memristor cells in the array which have reached the threshold are flagged as operable in only the volatile mode.

14. The method of claim 1, wherein the high writing load comprises a pulse having a larger voltage or longer duration than a pulse of the low writing load.

15. The memristor memory of claim 8, wherein the high writing load comprises a pulse having a larger voltage or longer duration than a pulse of the low writing load.

16. A memristor memory comprising:
a memristor cell configured to change state based on application of an electric potential, the memristor cell comprising a channel having a resistance, the resistance of the channel set to a first resistance value in response to a current flow in a first direction through the channel, and the resistance set to a different second resistance value in response to a current flow in a different second direction through the channel, wherein the first resistance value represents a first state of the memristor cell, and the second resistance value represents a second state of the memristor cell; and
a controller to:
operate the memristor cell in a volatile mode by switching a state of the memristor cell with a low writing load, and in a non-volatile mode by switching a state of the memristor cell with a high writing load;
monitor a number of state switches of the memristor cell in the non-volatile mode; and
in response to the number of state switches of the memristor cell in the non-volatile mode reaching a threshold, allow an operation of the memristor cell in the volatile mode, and prevent an operation of the memristor cell in the non-volatile mode.

17. The memristor memory of claim 16, wherein the controller is to allow operation of the memristor cell in both the non-volatile mode and the volatile mode prior to the number of state switches of the memristor cell in the non-volatile mode reaching the threshold.

18. The memristor memory of claim 16, wherein the high writing load comprises a pulse having a larger voltage or longer duration than a pulse of the low writing load.

* * * * *